(12) United States Patent
Yazawa et al.

(10) Patent No.: US 9,064,919 B2
(45) Date of Patent: Jun. 23, 2015

(54) INDUSTRIAL ROBOT

(75) Inventors: Takayuki Yazawa, Nagano (JP); Hiroto Nakajima, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 751 days.

(21) Appl. No.: 13/392,040

(22) PCT Filed: Aug. 25, 2010

(86) PCT No.: PCT/JP2010/064342
§ 371 (c)(1),
(2), (4) Date: Apr. 9, 2012

(87) PCT Pub. No.: WO2011/024839
PCT Pub. Date: Mar. 3, 2011

(65) Prior Publication Data
US 2012/0189419 A1   Jul. 26, 2012

(30) Foreign Application Priority Data
Aug. 26, 2009   (JP) .................. 2009-194967

(51) Int. Cl.
*B25J 9/06* (2006.01)
*H01L 21/677* (2006.01)
*B25J 9/04* (2006.01)

(52) U.S. Cl.
CPC ......... *H01L 21/67742* (2013.01); *Y10S 901/46* (2013.01); *Y10S 414/135* (2013.01); *B25J 9/042* (2013.01); *H01L 21/67766* (2013.01); *B25J 9/043* (2013.01)

(58) Field of Classification Search
CPC ........................................ B25J 9/043
See application file for complete search history.

(56) References Cited

U.S. PATENT DOCUMENTS 6,428,266 B1 *   8/2002   Solomon et al. ........... 414/744.4
(Continued)

FOREIGN PATENT DOCUMENTS

| JP | 2002-172570 | 6/2002 |
| JP | 2002-534282 | 10/2002 |

(Continued)

OTHER PUBLICATIONS

International Search Report for Application No. PCT/JP2010/064342 mailed Sep. 21, 2010.

*Primary Examiner* — Scott Lowe
(74) *Attorney, Agent, or Firm* — Frommer Lawrence & Haug LLP

(57) ABSTRACT

An industrial robot including a first arm which has a first arm portion, and a second arm portion supported by the first arm portion. The industrial robot also includes a second arm which has a third arm portion and a fourth arm portion supported by the third arm portion. The first arm and the second arm can be expanded/retracted independently. A turning center of the first arm portion and a turning center of the third arm portion are placed coaxially. The first arm and the second arm are constructed so as to be almost line-symmetric with respect to an imaginary line under the condition that the first arm and the second arm are retracted. The first arm portion, the third arm portion, the second arm portion, and the fourth arm portion are placed in this order in a vertical direction.

7 Claims, 9 Drawing Sheets

(56) References Cited

U.S. PATENT DOCUMENTS

| | | | | |
|---|---|---|---|---|
| 2001/0036398 | A1* | 11/2001 | Hofmeister | 414/744.1 |
| 2005/0079042 | A1* | 4/2005 | Maeda | 414/744.2 |
| 2006/0099063 | A1* | 5/2006 | Pietrantonio et al. | 414/744.5 |
| 2007/0151388 | A1* | 7/2007 | Yazawa et al. | 74/490.01 |
| 2010/0178147 | A1* | 7/2010 | Kremerman et al. | 414/744.5 |

FOREIGN PATENT DOCUMENTS

| | | |
|---|---|---|
| JP | 2004-288719 | 10/2004 |
| JP | 2008-502498 | 1/2008 |
| JP | 2008-284629 | 11/2008 |
| WO | WO 00/40379 | 7/2000 |
| WO | WO 2005/123565 | 12/2005 |

\* cited by examiner

INDUSTRIAL ROBOT

The present application claims priority from PCT Patent Application No. PCT/JP2010/064342 filed on Aug. 25, 2010, which claims priority from Japanese Patent Application No. JP 2009-194967 filed on Aug. 26, 2009, the disclosures of which is incorporated herein by reference in its entirety.

1. FIELD OF THE INVENTION

The present invention relates to an industrial robot for transferring a predetermined transfer object.

2. DESCRIPTION OF RELATED ART

Conventionally, known is an industrial robot equipped with two arms that expand/retract at the time of transferring a transfer object, a hand installed at the top end side of each of the two arms, and a chassis that supports the two arms; wherein the industrial robot being used as an industrial robot for transferring a transfer object, such as a semi-conductor wafer, an LCD glass substrate, and the like (For example, refer to Japanese Unexamined Patent Application Publication No. 2008-284629 ("JP 2008-284629")). In an industrial robot described in JP 2008-284629, each of the two arms is equipped with a parallel 4-bar linkage mechanism. Then, a hand moves in a linear motion by the action of the parallel 4-bar linkage mechanism, when the arm expands/retracts.

In the case of this industrial robot, the two arms are structured in such a way that the two hands are stacked up in a vertical direction when the two arms are retracted. Then, wherein one arm equipped with the hand located at a higher side being identified as a first arm, and the other arm equipped with the hand located at a lower side being identified as a second arm; the parallel 4-bar linkage mechanism in this industrial robot is structured in such a way that the second arm cannot be expanded under the condition of the first arm being expanded, and the first arm cannot be expanded under the condition of the second arm being expanded.

Therefore, in the case of the industrial robot described in JP 2008-284629, the hand installed in the second arm cannot take a transfer object in and out of a storing section in which the transfer object is stored unless the first arm is retracted, and meanwhile the hand installed in the first arm cannot take a transfer object in and out of a storing section unless the second arm is retracted. Thus, the industrial robot described in JP 2008-284629 cannot expand/retract the two arms independently. Therefore, even though the industrial robot described in JP 2008-284629 is equipped with the two arms, each arm cannot independently take a transfer object in and out of a storing section so that unfortunately it takes a long time to carry out transferring operation for transfer objects.

Then, conventionally known is an industrial robot in which two arms can independently take a transfer object in and out of a storing section while the two arms being expanded/retracted independently (For example, refer to Japanese Unexamined Patent Application Publication No. 2002-172570 ("JP 2002-172570") and Japanese Unexamined Patent Application Publication No. 2004-288719 ("JP 2004-288719")). An industrial robot described in JP 2002-172570 includes a first arm supporting a first hand, a second arm supporting a second hand, and a cylindrical base section. In the industrial robot, the first arm has a first rotary support axis provided at the base section, a first link supported by the first rotary support axis in such a way as to be rotatable, a second rotary support axis provided at a drive end of the first link, a second link supported by the second rotary support axis in such a way as to be rotatable; and in the meantime, the second arm has a first rotary support axis provided at the base section, a first link supported by the first rotary support axis in such a way as to be rotatable, a second rotary support axis provided at a drive end of the first link, a second link supported by the second rotary support axis in such a way as to be rotatable.

The industrial robot described in JP 2002-172570 has a large clearance formed between the first link and the second link in the first arm in such a way that the second arm and the second hand do not interfere with the second link of the first arm when the first arm expands/retracts; and then the second arm and the second hand are placed within the clearance. Furthermore, in this industrial robot, the first link of the first arm is different from the first link of the second arm in their length and shape, and the second link of the first arm is different from the second link of the second arm in their length and shape.

An industrial robot described in JP 2004-288719 includes a first multi-joint arm; composed of a turning arm, an intermediate arm, and a substrate holding arm; and a second multi-joint arm; composed of a turning arm, an intermediate arm, and a substrate holding arm. In this industrial robot, the turning arm of the second multi-joint arm and the turning arm of the first multi-joint arm are arranged in this order from a bottom side, in a view from a horizontal direction. Furthermore, in this industrial robot, the intermediate arm of the first multi-joint arm and the intermediate arm of the second multi-joint arm are placed at the same elevation; and meanwhile, the substrate holding arm of the first multi-joint arm and the substrate holding arm of the second multi-joint arm are placed at the same elevation, in a view from the horizontal direction.

Moreover, the industrial robot described in JP 2004-288719 includes a first turning drive section for turning the first multi-joint arm, a second turning drive section for turning the second multi-joint arm, a first expanding/retracting drive section that expands/retracts the first multi-joint arm, and a second expanding/retracting drive section that expands/retracts the second multi-joint arm.

The industrial robots described in JP 2002-172570 and JP 2004-288719 can expand/retract two arms independently to take a transfer object in and out of a storing section independently by using the two arms so that the time of transferring operation for transfer objects can be reduced.

On the other hand, the industrial robot described in JP 2002-172570 has a large clearance formed between the first link and the second link in the first arm, and the second arm and the second hand are located within the clearance. Then, in this industrial robot, the first link of the first arm is different from the first link of the second arm in their length and shape, and the second link of the first arm is different from the second link of the second arm in their length and shape. As a result, the first arm and the second arm of the industrial robot described in JP 2002-172570 are ill-balanced in terms of their weight.

In the meantime, in the industrial robot described in JP 2004-288719; even though the turning arm of the second multi-joint arm and the turning arm of the first multi-joint arm are arranged in this order from a bottom side, the intermediate arm of the first multi-joint arm and the intermediate arm of the second multi-joint arm are placed at the same elevation. Therefore, a distance between the turning arm and the intermediate arm in the second multi-joint arm is longer than a distance between the turning arm and the intermediate arm in the first multi-joint arm. As a result, the first multi-joint arm and the second multi-joint arm of the industrial robot described in JP 2004-288719 are ill-balanced in terms of their weight.

Thus, the first arm and the second arm of the industrial robot described in JP 2002-172570 are ill-balanced in terms of their weight, and meanwhile, the first multi-joint arm and the second multi-joint arm of the industrial robot described in JP 2004-288719 are ill-balanced in terms of their weight. Therefore, in the industrial robots described in the JP 2002-172570 and JP 2004-288719, expanding/retracting motion of the two arms is likely to become unstable, and turning motion of the two arms with reference to the base section is also likely to become unstable.

SUMMARY OF THE INVENTION

Then, it is a subject of the present invention to provide an industrial robot that is able to stabilize expanding/retracting motion of its two arms as well as turning motion of the two arms with reference to a main body section, even though the two arms can be expanded/retracted independently.

To bring a solution for the subject described above, an industrial robot according to the present invention, being for taking a transfer object out of a storing section where the transfer object is stored, and bringing the transfer object into the storing section; the industrial robot includes: a first hand and a second hand, on each of which the transfer object is mounted; a first arm that supports the first hand so as to keep it rotatable at a top end side of the first arm itself, and expands/retracts at the time of taking the transfer object out of and bringing the same into the storing section; a second arm that supports the second hand so as to keep it rotatable at a top end side of the second arm itself, and expands/retracts at the time of taking the transfer object out of, and bringing the same into the storing section; a driving mechanism for expanding/retracting the first arm and the second arm; and a main body section that houses a part of the driving mechanism; wherein the first arm comprises a first arm portion that is rotatable with respect to the main body section, while using a root end side of the first arm portion as a rotation center; and a second arm portion, a root end side of which is so supported as to be rotatable at a top end side of the first arm portion; the second arm comprises a third arm portion that is rotatable with respect to the main body section, while using a root end side of the third arm portion as a rotation center; and a fourth arm portion, a root end side of which is so supported as to be rotatable at a top end side of the third arm portion; the driving mechanism is so structured as to enable expansion/contraction of the first arm and the same of the second arm independently; a turning center of the first arm portion and a turning center of the third arm portion are placed coaxially; in a view from an upper elevation over the industrial robot when the first arm and the second arm are retracted, the first arm and the second arm are so constructed as to be almost line-symmetric with respect to an imaginary line that passes through the turning center of the first arm portion and the third arm portion; and the first arm portion, the third arm portion, the second arm portion, and the fourth arm portion are placed in this order from a lower side to a higher side, in a view from a horizontal direction.

In the industrial robot according to the present invention, the turning center of the first arm portion and the turning center of the third arm portion are placed coaxially; and then in a view from an upper elevation over the industrial robot when the first arm and the second arm are retracted, the first arm and the second arm are so constructed as to be almost line-symmetric with respect to the imaginary line that passes through the turning center of the first arm portion and the third arm portion. In the meantime, the first arm portion, the third arm portion, the second arm portion, and the fourth arm portion are placed in this order from a lower side to a higher side, in a view from a horizontal direction. Then, according to the present invention, the first arm and the second arm can easily become well-balanced in terms of their weight. Therefore, according to the present invention, even though the driving mechanism is so structured as to enable expansion/contraction of the first arm and the same of the second arm independently, it becomes possible to stabilize expanding/retracting motion of the two arms as well as turning motion of the two arms with reference to the main body section. Furthermore, according to the present embodiment, part of constituent elements of the first arm and part of constituent elements of the second arm can be prepared in accordance with a common design, so that a production cost of the industrial robot can be reduced.

In the present invention, for example, the first hand is so supported as to be rotatable at a top end side of the second arm portion; and the second hand is so supported as to be rotatable at a top end side of the fourth arm portion.

In the present invention, it is preferable that; the driving mechanism includes: a first turning axis having its axis center with the turning center of the first arm portion and the third arm portion; a second turning axis that is hollow and placed in coaxial with the first turning axis in such a way as to cover an outer circumference of the first turning axis; a third turning axis that is hollow and placed in coaxial with the first turning axis in such a way as to cover an outer circumference of the second turning axis; a first drive power source for turning the first turning axis; a second drive power source for turning the second turning axis; and a third drive power source for turning the third turning axis; the first arm includes: a first turning member placed at the root end side in the first arm portion shaped so as to be hollow; a second turning member placed at the top end side in the first arm portion; and a first transmission member for transmitting drive power from the first turning member to the second turning member; the second arm includes: a third turning member placed at the root end side in the third arm portion shaped so as to be hollow; a fourth turning member placed at the top end side in the third arm portion; and a second transmission member for transmitting drive power from the third turning member to the fourth turning member; the root end side of the third arm portion is fixed to the first turning axis; the first turning member and the third turning member are fixed to the second turning axis; the root end side of the first arm portion is fixed to the third turning axis; the second turning member is so supported in the first arm portion as to be rotatable, and the second arm portion is fixed to the second turning member; and the fourth turning member is so supported in the third arm portion as to be rotatable, and the fourth arm portion is fixed to the fourth turning member.

According to the structure described above, the second arm can be expanded/retracted by means of turning the first turning axis, and meanwhile the first arm can be expanded/retracted by means of turning the third turning axis. In other words, the first arm and the second arm can be expanded/retracted independently. Furthermore, according to the structure described above, the first arm and the second arm can turn together around with respect to the main body section, without any expansion/retraction, by means of turning the first turning axis, the second turning axis, and the third turning axis at the same time.

In the present invention, for example, each of the first turning member, the second turning member, the third turning member, and the fourth turning member is a pulley, and each of the first transmission member and the second transmission member is a belt. In this case, the belt is, for example, a flat belt made of metal. In this case, alternatively for example, the pulley is a pulley with gears, and the belt is a belt with gears.

In the present invention, preferably the industrial robot is provided with a third arm portion bearing that supports the third arm portion so as to keep it rotatable, and the third arm portion bearing is mounted onto the second turning axis. According to this structure, in comparison to the case where the third arm portion bearing is mounted in the first arm portion positioned under the third arm portion, this structure makes it possible to simplify the structure around the third arm portion bearing. Therefore, a section surrounding the third arm portion bearing can be downsized.

In the present invention, preferably the industrial robot is provided with a first position detecting mechanism for detecting a relative turning position of the second turning axis with respect to the main body section; a second position detecting mechanism for detecting a relative turning position of the first turning axis with respect to the second turning axis; and a third position detecting mechanism for detecting a relative turning position of the third turning axis with respect to the second turning axis. According to this structure, the turning positions of the two arms with respect to the main body section as well as the expansion/retraction status of the two arms can appropriately be detected by using the first position detecting mechanism, the second position detecting mechanism, and the third position detecting mechanism.

Advantageous Effect of the Invention

As described above, the industrial robot according to the present invention can stabilize expanding/retracting motion of its two arms as well as turning motion of the two arms with reference to the main body section, even though the two arms can be expanded/retracted independently.

BRIEF DESCRIPTION OF THE DRAWINGS

FIG. 1 includes plan views showing an industrial robot according to an embodiment of the present invention.

FIG. 9 includes views for explaining general movement of the industrial robot shown in FIG. 1.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1A:
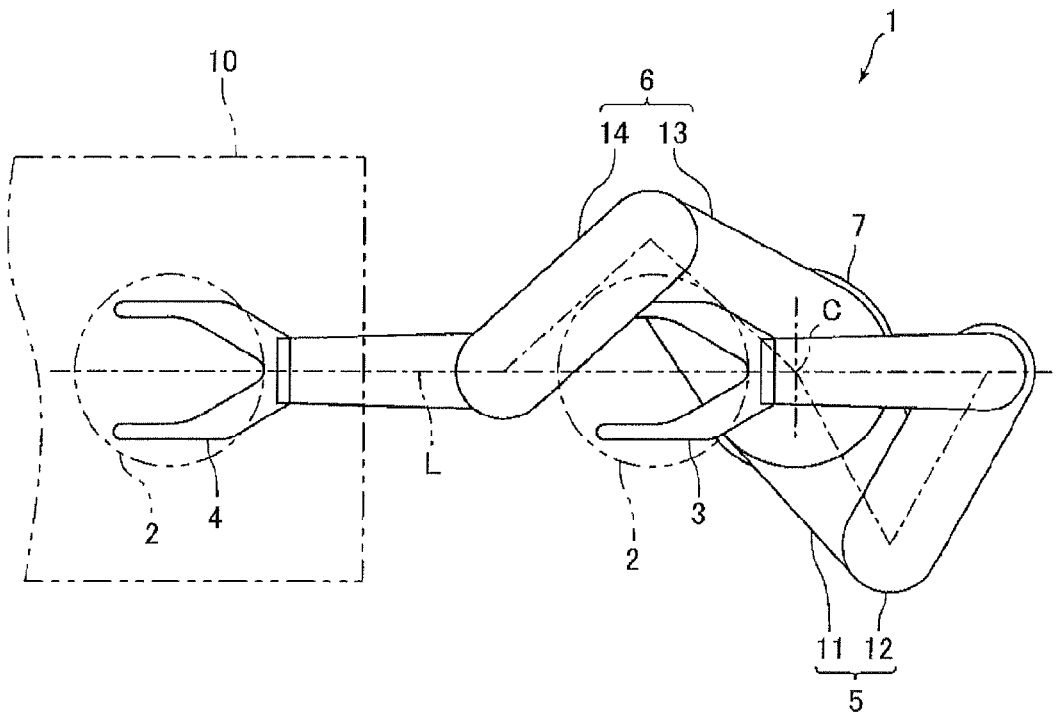
FIG. 1A illustrates the industrial robot under the condition that a first arm is retracted and a second arm is expanded. Meanwhile.
Figure 1B:
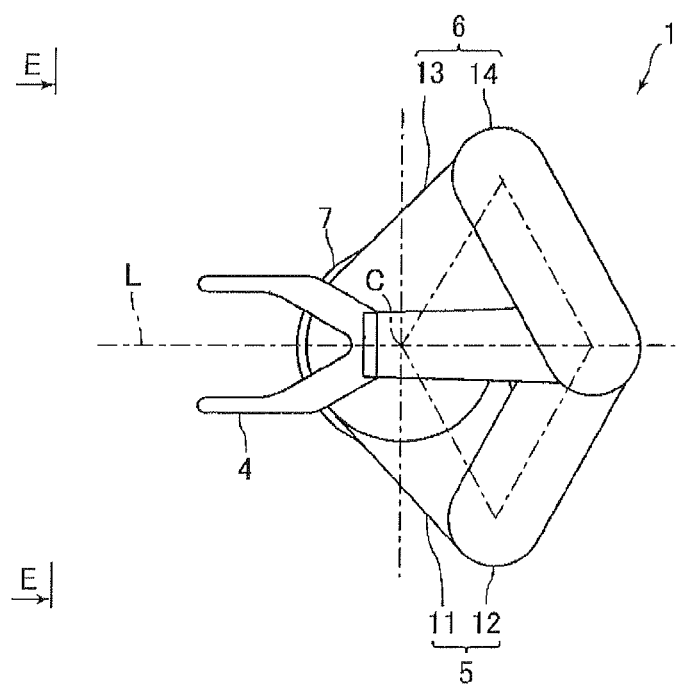
FIG. 1B illustrates the industrial robot under the condition that both the first arm and the second arm are retracted.
Figure 2:
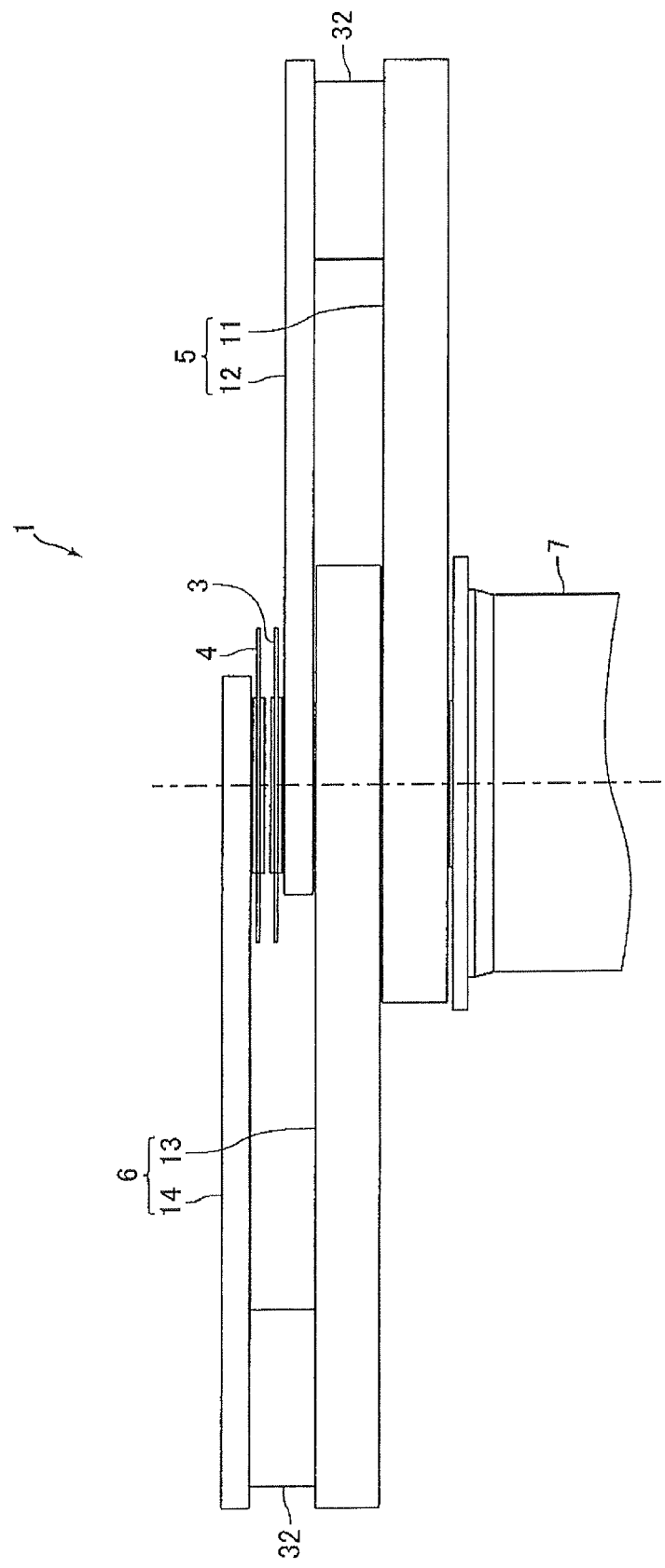
FIG. 2 is a side view drawing of the industrial robot, viewed from a direction of E-E indicated in FIG. 1B.
Figure 3:
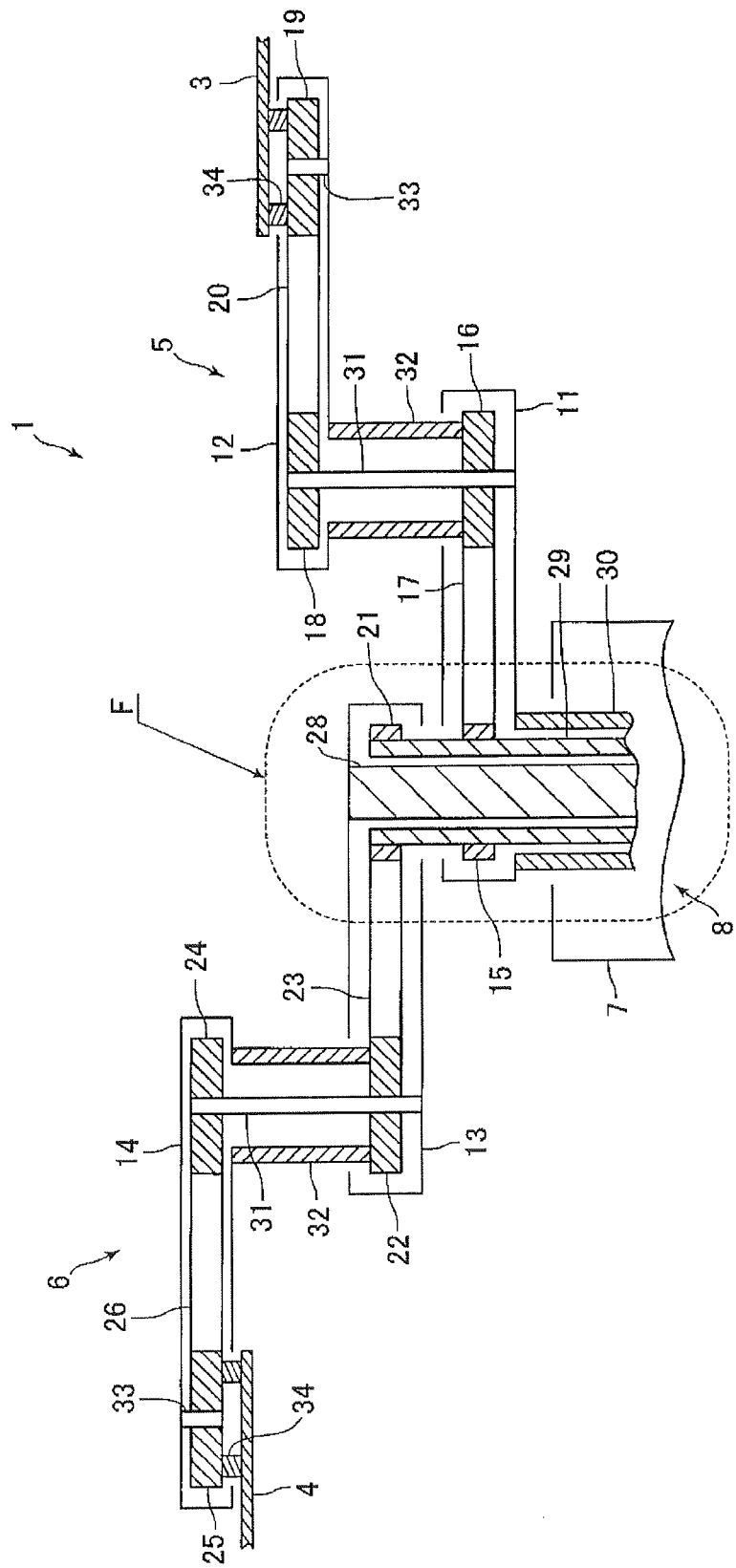
FIG. 3 is a schematic view for explaining a general structure of a power transmission mechanism of the industrial robot shown in FIG. 1.

General Structure of Industrial Robot:

FIG. 1 includes plan views showing an industrial robot 1 according to an embodiment of the present invention. FIG. 1A illustrates the robot under the condition that a first arm 5 is retracted and a second arm 6 is expanded. Meanwhile, FIG. 1B illustrates the robot under the condition that both the first arm 5 and the second arm 6 are retracted. FIG. 2 is a side view drawing of the industrial robot 1, viewed from a direction of E-E indicated in FIG. 1B. FIG. 3 is a schematic view for explaining a general structure of a power transmission mechanism of the industrial robot 1 shown in FIG. 1.

The industrial robot 1 according to the present embodiment (hereinafter, called "the robot 1") is a robot for transferring a thin disc semiconductor wafer 2 (hereinafter, called "the wafer 2"), as a transfer object. As shown in FIG. 1 and FIG. 2, the robot 1 includes a first hand 3 and a second hand 4, on each of which the wafer 2 is mounted, an expand-/retract-able first arm 5 that supports the first hand 3 so as to keep it rotatable at a top end side of the first arm itself, an expand-/retract-able second arm 6 that supports the second hand 4 so as to keep it rotatable at a top end side of the second arm itself, and a main body section 7 so shaped as to be cylindrical. The robot 1 further includes a driving mechanism 8 (Refer to FIG. 3) for expanding/retracting the first arm 5 and the second arm 6.

The industrial robot 1 is used, for example, while being built in a semiconductor manufacturing system (not illustrated). Specifically to describe, the industrial robot 1 is used, while being built in a semiconductor manufacturing system that includes an transmission chamber for transmitting the wafer 2 between the semiconductor manufacturing system and an external unit (not illustrated), a chamber 10 (Refer to FIG. 1A) such as a process chamber for implementing a predetermined process for the wafer 2, and a transfer chamber (not illustrated) in which the industrial robot 1 is installed.

The industrial robot 1 takes the wafer 2 out of the chamber 10, and also brings the wafer 2 into the chamber 10. Specifically to describe, while the first arm 5 and the second arm 6 expand/contact with respect to the main body section 7, the wafer 2 is taken out and brought into the chamber 10. More specifically to describe, in order to bring the wafer 2 into the chamber 10, the first arm 5 and the second arm 6, which have been retracted, expand to send the first hand 3 and the second hand 4 into the chamber 10. In the meantime, in order to take the wafer 2 out of the chamber 10, the first arm 5 and the second arm 6, which have been expanded to get into the chamber 10, retract to pull the first hand 3 and the second hand 4 out of the chamber 10. The chamber 10 in the present embodiment is a storing section where the wafer 2 as a transfer object is stored.

The first hand 3 and the second hand 4 are so shaped as to be almost Y-shaped in a view from a vertical direction, as shown in FIG. 1. Then, the wafer 2 is mounted on a top part of the first hand 3 and the same of the second hand 4, both being Y-shaped. Meanwhile, the first hand 3 and the second hand 4 are shaped in almost the same form.

The first arm 5 includes a first arm portion 11 and a second arm portion 12. The first arm portion 11 is rotatable with respect to the main body section 7, while using a root end side of the first arm portion 11 as a rotation center. In the meantime, a root end side of the second arm portion 12 is so supported as to be rotatable at a top end side of the first arm portion 11. Then, at a top end side of the second arm portion 12, a root end side of the first hand 3 is so supported as to be rotatable. The first arm portion 11 and the second arm portion 12 are constructed to be hollow.

The second arm 6 includes a third arm portion 13 and a fourth arm portion 14. The third arm portion 13 is rotatable with respect to the main body section 7, while using a root end side of the third arm portion 13 as a rotation center. In the meantime, a root end side of fourth arm portion 14 is so supported as to be rotatable at a top end side of the third arm portion 13. Then, at a top end side of the fourth arm portion 14, a root end side of the second hand 4 is so supported as to be rotatable. The third arm portion 13 and the fourth arm portion 14 are constructed to be hollow.

In the present embodiment, the first arm portion 11, the third arm portion 13, the second arm portion 12, and the fourth arm portion 14 are placed in this order from a lower side to a higher side, in a view from a horizontal direction, as shown in FIG. 2. Meanwhile, in the view from the horizontal direction, the first hand 3 and the second hand 4 are placed between the second arm portion 12 and the fourth arm portion 14. Specifically to describe, the first hand 3 is supported at an upper side surface of the second arm portion 12, while the second hand 4 is supported at a lower side surface of the fourth arm portion 14, and then, in the view from the horizontal direction, the second hand 4 is located above the first hand 3.

The first arm 5 includes a pulley 15, a pulley 16, and a belt 17, these three being placed inside the first arm portion 11; and a pulley 18, a pulley 19, and a belt 20, these three being placed inside the second arm portion 12, as shown in FIG. 3. The pulley 15 is placed at a root end side of the first arm portion 11, and meanwhile the pulley 16 is placed at a top end side of the first arm portion 11. Then, the belt 17 bridges between the pulley 15 and the pulley 16. The pulley 18 is placed at a root end side of the second arm portion 12, and meanwhile the pulley 19 is placed at a top end side of the second arm portion 12. Then, the belt 20 bridges between the pulley 18 and the pulley 19.

In the same manner, the second arm 6 includes a pulley 21, a pulley 22, and a belt 23, these three being placed inside the third arm portion 13; and a pulley 24, a pulley 25, and a belt 26, these three being placed inside the fourth arm portion 14. The pulley 21 is placed at a root end side of the third arm portion 13, and meanwhile the pulley 22 is placed at a top end side of the third arm portion 13. Then, the belt 23 bridges between the pulley 21 and the pulley 22. The pulley 24 is placed at a root end side of the fourth arm portion 14, and meanwhile the pulley 25 is placed at a top end side of the fourth arm portion 14. Then, the belt 26 bridges between the pulley 24 and the pulley 25.

Incidentally, the belts 17, 20, 23, and 26 may be made of metal such as a steel plate, or made of rubber. Furthermore, these belts 17, 20, 23, and 26 may be belts with gears, or flat belts, V-belts, or the like having no gears. If the belts 17, 20, 23, and 26 are flat belts, these belts 17, 20, 23, and 26 are, for example, made of metal. Meanwhile, the pulleys 15, 16, 18, 19, 21, 22, 24, and 25 may be pulleys with gears, or flat pulleys, V-pulleys, or the like having no gears.

The driving mechanism 8 includes a solid turning axis 28 as a first turning axis, which is placed at a center part of the main body section 7 in a radial direction; a first hollow turning axis 29 as a second turning axis, which is so placed as to cover an external surface of the solid turning axis 28 and to be concentric with the solid turning axis 28; and a second hollow turning axis 30 as a third turning axis, which is so placed as to cover an external surface of the first hollow turning axis 29 and to be concentric with the solid turning axis 28 and the first hollow turning axis 29. As described later, each of the solid turning axis 28, the first hollow turning axis 29, and the second hollow turning axis 30 is connected to an individual drive power source, so that each of them can turn, being relative to one another. Details of the driving mechanism 8 are described later.

At an upper end side of the solid turning axis 28, fixed is the root end side of the third arm portion 13. At an upper end side of the second hollow turning axis 30, fixed is the root end side of the first arm portion 11. In other words, a turning center of the first arm portion 11 and a turning center of the third arm portion 13 are placed coaxially in the present embodiment. At an upper end side of the first hollow turning axis 29, fixed are the pulley 15 and the pulley 21. Specifically to describe, the pulley 15 and the pulley 21 are fixed at the upper end side of the first hollow turning axis 29 in such a way that the pulley 21 is placed at a higher side and the pulley 15 is placed at a lower side.

At a bottom surface of the top end side of the first arm portion 11, fixed is a fixed shaft 31. At a lower end side of the fixed shaft 31, the pulley 16 is so supported as to be rotatable. In other words, the pulley 16 is so supported in the first arm portion 11 as to be rotatable. In the meantime, at a higher end side of the fixed shaft 31, fixed is the pulley 18. The second arm portion 12 is fixed to the pulley 16. Specifically to describe, the root end side of the second arm portion 12 is fixed to the pulley 16 by the intermediary of a connecting member 32.

At a bottom surface of the top end side of the second arm portion 12, fixed is a fixed shaft 33. The pulley 19 is so supported by the fixed shaft 33 as to be rotatable. In other words, the pulley 19 is so supported in the second arm portion 12 as to be rotatable. The first hand 3 is fixed to the pulley 19. Specifically to describe, the root end side of the first hand 3 is fixed to the pulley 19 by the intermediary of a connecting member 34.

In the same manner, at a bottom surface of the top end side of the third arm portion 13, fixed is a fixed shaft 31. At a lower end side of the fixed shaft 31, the pulley 22 is so supported as to be rotatable. In other words, the pulley 22 is so supported in the third arm portion 13 as to be rotatable. In the meantime, at a higher end side of the fixed shaft 31, fixed is the pulley 24. The fourth arm portion 14 is fixed to the pulley 22. Specifically to describe, the root end side of the fourth arm portion 14 is fixed to the pulley 22 by the intermediary of a connecting member 32.

Moreover, in the same manner, at a top surface of the top end side of the fourth arm portion 14, fixed is a fixed shaft 33. The pulley 25 is so supported by the fixed shaft 33 as to be rotatable. In other words, the pulley 25 is so supported in the fourth arm portion 14 as to be rotatable. The second hand 4 is fixed to the pulley 25. Specifically to describe, the root end side of the second hand 4 is fixed to the pulley 25 by the intermediary of a connecting member 34.

In the present embodiment, the first arm portion 11 and the third arm portion 13 are shaped in almost the same form, and meanwhile the second arm portion 12 and the fourth arm portion 14 are shaped in almost the same form. In other words, the first arm 5 and the second arm 6 are shaped in almost the same form. Moreover, the pulley 15 and the pulley 21 are the same; the pulley 16 and the pulley 22 are the same; the pulley 18 and the pulley 24 are the same; and the pulley 19 and the pulley 25 are the same. Furthermore, the belt 17 and the belt 23 are the same, and the belt 20 and the belt 26 are the same.

Meanwhile, as shown in FIG. 1B, in a view from an upper elevation over the robot 1 when the first arm 5 and the second arm 6 are retracted, the first arm 5 and the second arm 6 are placed almost symmetrically with respect to an imaginary line "L" that passes through the turning center "C" of the first arm portion 11 and the third arm portion 13. Namely, in the view from the upper elevation over the robot 1 when the first arm 5 and the second arm 6 are retracted, the first arm 5 and the second arm 6 are so constructed as to be almost line-symmetric with respect to an imaginary line "L". Incidentally, in the view from the upper elevation over the robot 1 when the first arm 5 and the second arm 6 are retracted, the first hand 3 and the second hand 4 are stacked up.

Furthermore, in the present embodiment, a pulley interval between the pulley 15 and the pulley 16, a pulley interval between the pulley 18 and the pulley 19, a pulley interval between the pulley 21 and the pulley 22, and a pulley interval between the pulley 24 and the pulley 25 are the same. Moreover, a ratio between diameter of the pulley 15 and the pulley 16 as well as a ratio between diameter of the pulley 21 and the pulley 22 are 2:1, and meanwhile a ratio between diameter of the pulley 18 and the pulley 19 as well as a ratio between diameter of the pulley 24 and the pulley 25 are 1:2.

Therefore, in the present embodiment, an angle formed by the first hand 3 and the second arm portion 12 as well as an angle formed by the second arm portion 12 and the first arm portion 11 change at the time of expansion/retraction of the first arm 5 to be described later, and meanwhile the first hand 3 moves along an imaginary line (i.e., the imaginary line "L") stretching through a center of the pulley 15 (i.e., the center of the main body section 7) and a center of the pulley 19 (i.e., a turning center of the first hand 3) while an orientation of the first hand 3 being kept constant. In the same manner, an angle formed by the second hand 4 and the fourth arm portion 14 as well as an angle formed by the fourth arm portion 14 and the third arm portion 13 change at the time of expansion/retraction of the second arm 6, and meanwhile the second hand 4 moves along an imaginary line (i.e., the imaginary line "L") stretching through a center of the pulley 21 and a center of the pulley 25 while an orientation of the second hand 4 being kept constant.

The pulley 15 in the present embodiment is a first turning member placed at the root end side in the first arm portion 11, and the pulley 16 is a second turning member placed at the top end side in the first arm portion 11. Then, the belt 17 is a first transmission member for transmitting drive power from the pulley 15 as the first turning member to the pulley 16 as the second turning member. In the meantime, the pulley 21 is a third turning member placed at the root end side in the third arm portion 13, and the pulley 22 is a fourth turning member placed at the top end side in the third arm portion 13. Then, the belt 23 is a second transmission member for transmitting drive power from the pulley 21 as the third turning member to the pulley 22 as the fourth turning member.

Figure 4:
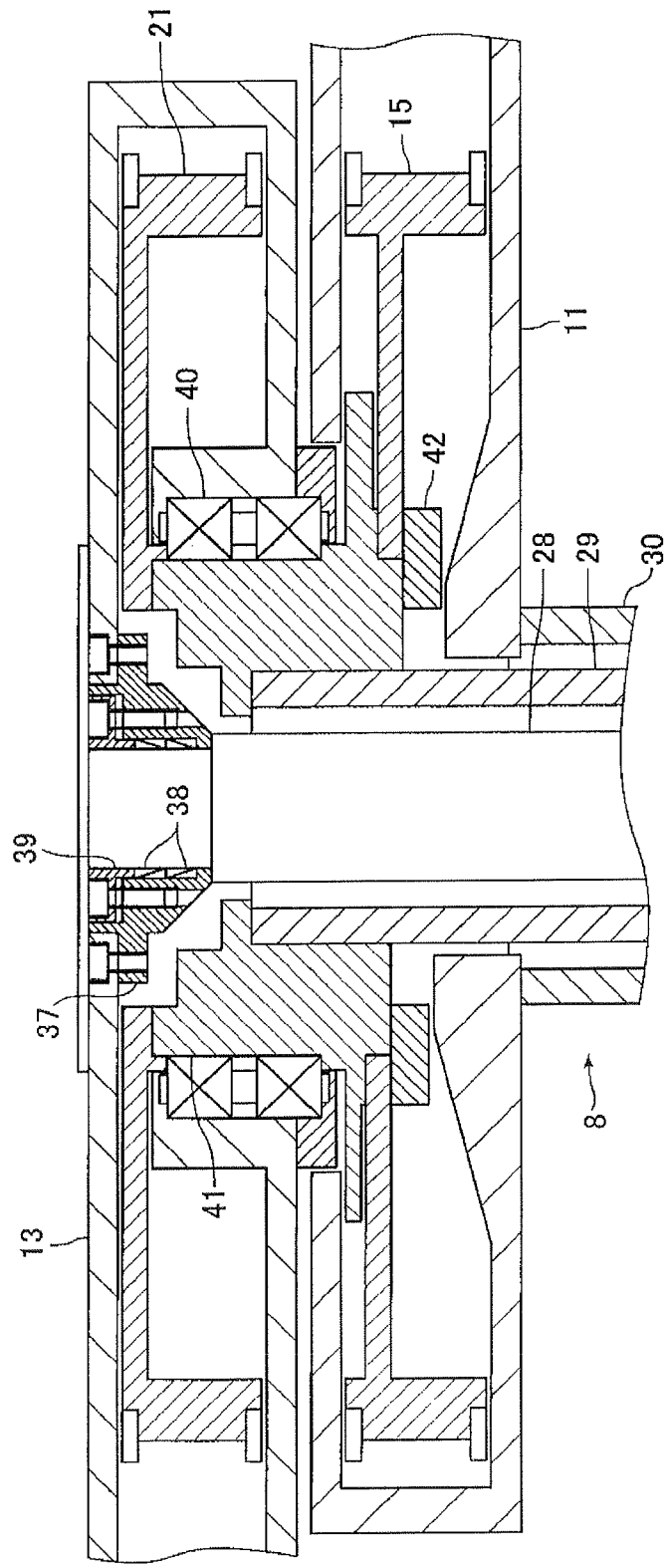
FIG. 4 is a cross-sectional view for explaining a specific structure of a section "F" indicated in FIG. 3.

Supporting Structure of the Third Arm Portion:

FIG. 4 is a cross-sectional view for explaining a specific structure of a section "F" indicated in FIG. 3.

As described above, the root end side of the third arm portion 13 is fixed at the upper end side of the solid turning axis 28, and the third arm portion 13 is rotatable with respect the main body section 7 while using the root end side of the third arm portion 13 as a rotation center. Explained below is a supporting structure of the third arm portion 13.

As shown in FIG. 4, an upper surface part of the root end side of the third arm portion 13 is fixed to a fixing member 37 for fixing the third arm portion 13 to the solid turning axis 28. In the fixing member 37, formed is a insertion bore for inserting an upper end part of the solid turning axis 28, and a keyless shaft-hub locking device 38 is placed between an inner circumference surface of the insertion bore and an outer circumference surface of the upper end part of the solid turning axis 28. In the present embodiment, the fixing member 37 is fixed to the upper end side of the solid turning axis 28 by using the keyless shaft-hub locking device 38. Namely, the fixing member 37 and the keyless shaft-hub locking device 38 are used for fixing the third arm portion 13 to the solid turning axis 28. Incidentally, a retainer 39 prevents the keyless shaft-hub locking device 38 from dropping out upward, as shown in FIG. 4.

The third arm portion 13 is supported by using a bearing 40 so as to be rotatable. The bearing 40 is mounted onto the first hollow turning axis 29. Specifically to describe, the bearing 40 is fixed to an upper end side of the first hollow turning axis 29 by the intermediary of a bearing retainer 41. Namely, the bearing retainer 41 is fixed to the upper end side of the first hollow turning axis 29, and then the bearing 40 is fixed to an outer circumference side of the bearing retainer 41. The bearing 40 in the present embodiment is a third arm portion bearing for supporting the third arm portion 13 in such a way as to keep it rotatable.

The pulley 15 and the pulley 21 are also fixed to the bearing retainer 41. Specifically to describe, the pulley 21 is fixed to an upper end surface side of the bearing retainer 41, and meanwhile the pulley 15 is fixed to a lower end surface side of the bearing retainer 41. Then, the pulley 15 and the pulley 21 are fastened to the bearing retainer 41 with a fastening plate 42 and a fixing screw (not shown).

Figure 5:
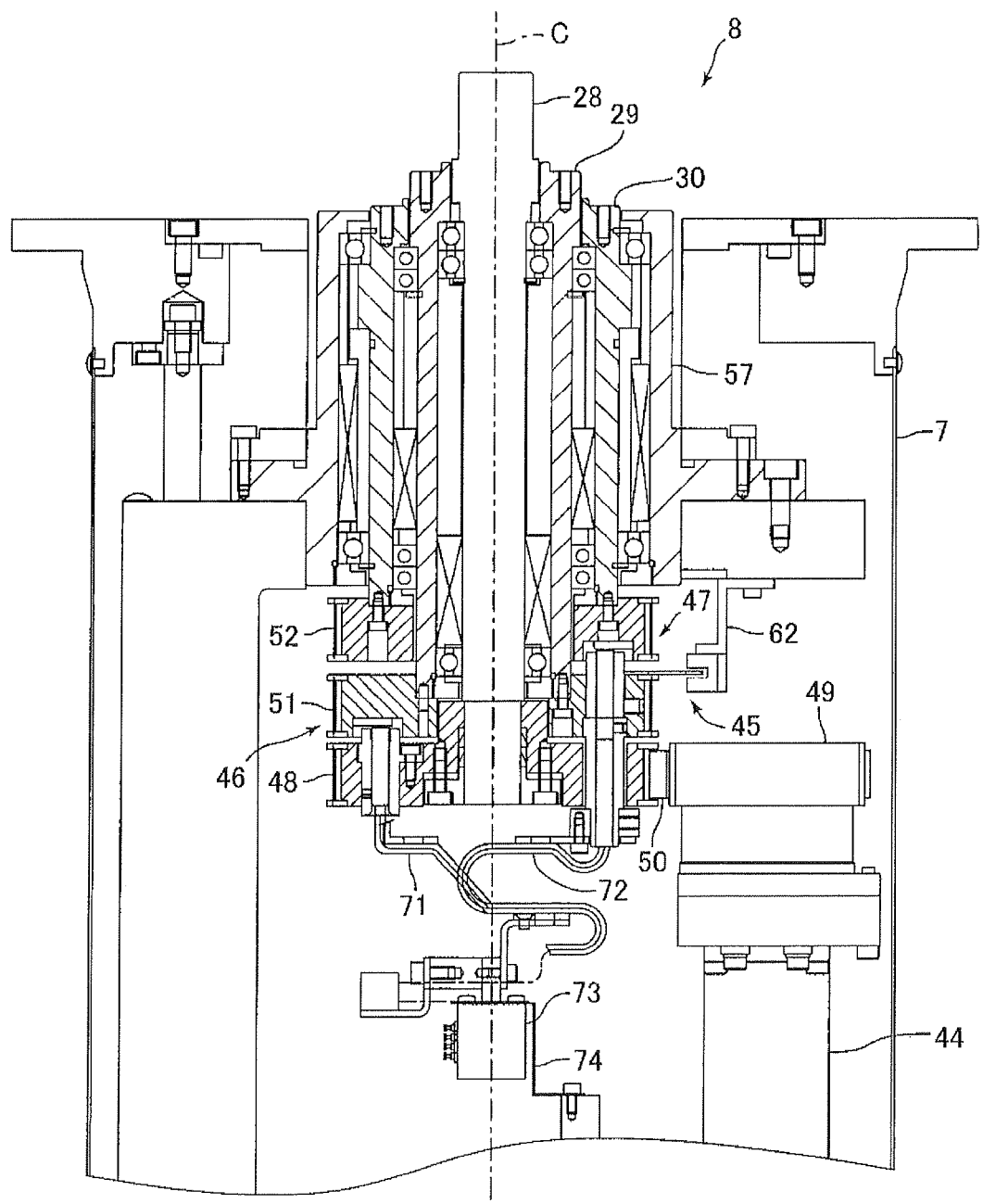
FIG. 5 is a cross-sectional view for explaining a general structure of a driving mechanism shown in FIG. 3.
Figure 6:
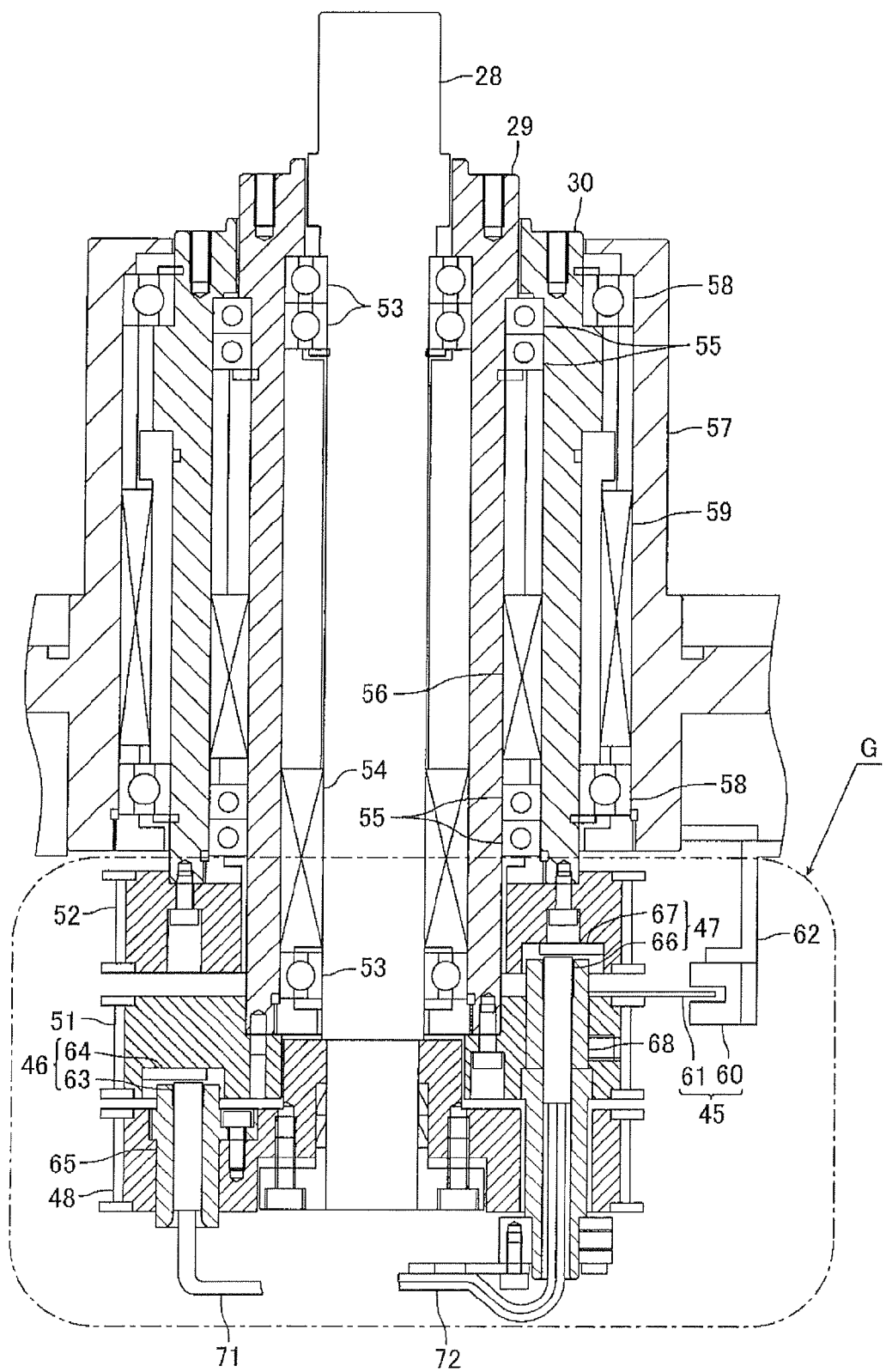
FIG. 6 is an enlarged view of a main part shown in FIG. 5.
Figure 7:
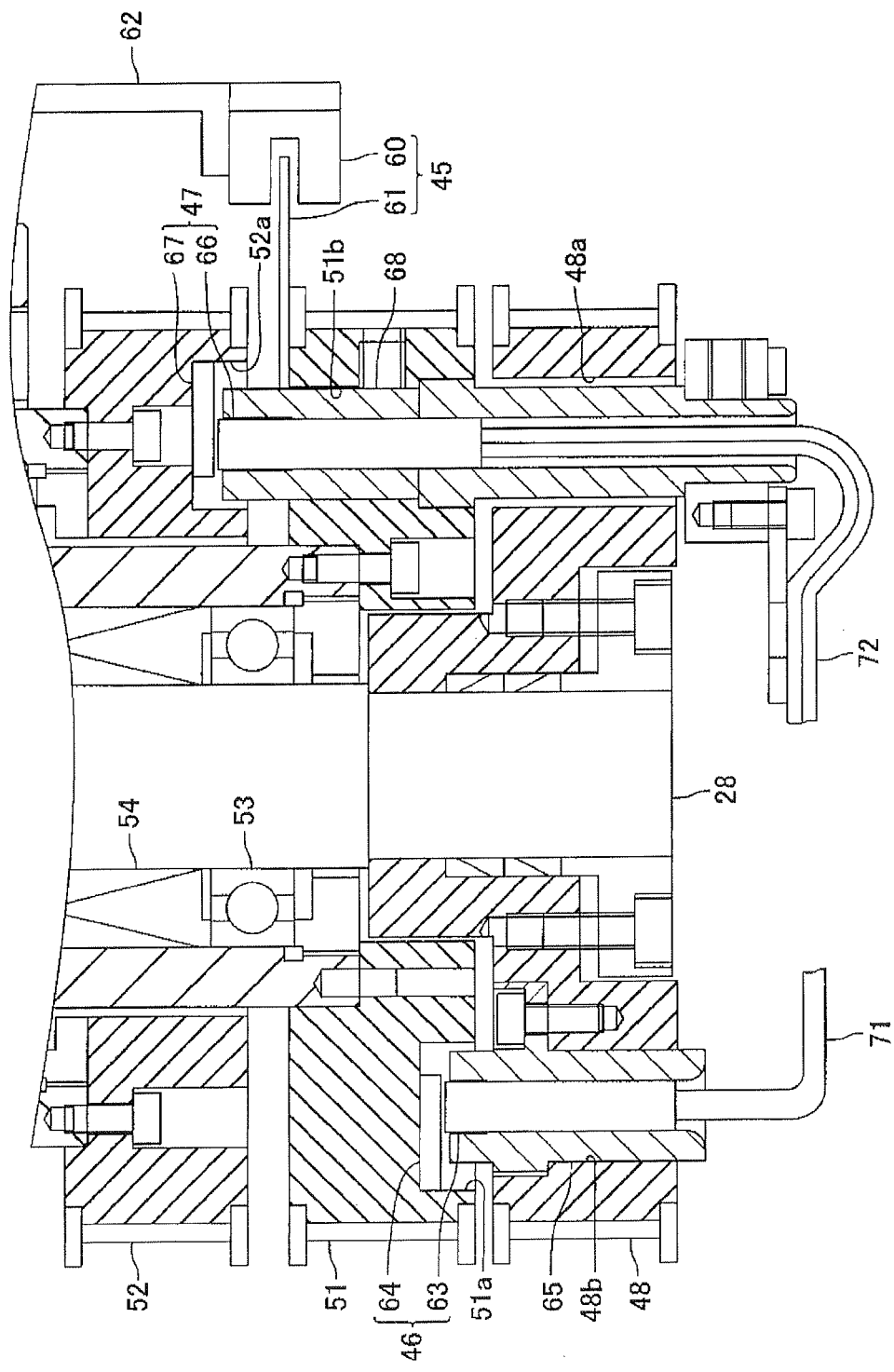
FIG. 7 is an enlarged view of a section "G" indicated in FIG. 6.
Figure 8:
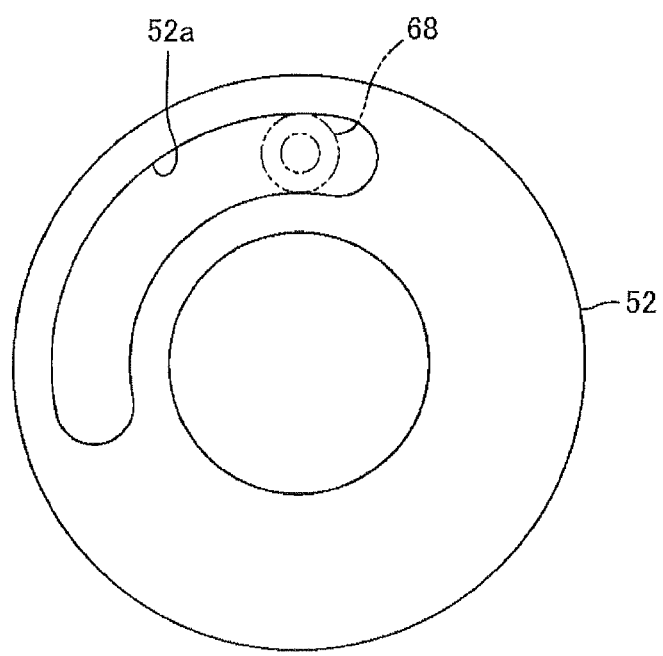
FIG. 8 is a drawing for explaining a guide groove portion formed in a pulley shown in FIG. 6.

General Structure of the Driving Mechanism and a Position Detecting Mechanism:

FIG. 5 is a cross-sectional view for explaining a general structure of the driving mechanism 8 shown in FIG. 3. FIG. 6 is an enlarged view of a main part shown in FIG. 5. FIG. 7 is an enlarged view of a section "G" indicated in FIG. 6. FIG. 8 is a drawing for explaining a guide groove portion 52a formed in a pulley 52 shown in FIG. 6.

Having the solid turning axis 28 described above, the first hollow turning axis 29, and the second hollow turning axis 30; the driving mechanism 8 additionally includes a first motor 44 as a first drive power source for turning the solid turning axis 28, a second motor (not shown) as a second drive power source for turning the first hollow turning axis 29, and a third motor (not shown) as a third drive power source for turning the second hollow turning axis 30. Structural components of the driving mechanism 8; except some parts at the upper end side of the solid turning axis 28, the first hollow turning axis 29, and the second hollow turning axis 30; are stored in the main body section 7.

Furthermore, placed in the main body section 7 are a first position detecting mechanism 45 for detecting a relative turning position of the first hollow turning axis 29 with respect to the main body section 7, a second position detecting mechanism 46 for detecting a relative turning position of the solid turning axis 28 with respect to the first hollow turning axis 29, and a third position detecting mechanism 47 for detecting a relative turning position of the second hollow turning axis 30 with respect to the first hollow turning axis 29. Moreover, placed in the main body section 7 is an elevating mechanism (not shown) for elevating the solid turning axis 28, the first hollow turning axis 29, and the second hollow turning axis 30 collectively.

A pulley 48 is fixed at a lower end side of the solid turning axis 28. As shown in FIG. 5, the belt 50 bridges between a pulley 49, fixed to an output shaft of the first motor 44, and the pulley 48. A pulley 51 is fixed at a lower end side of the first hollow turning axis 29. A belt (not shown) bridges between a pulley (not shown), fixed to an output shaft of the second motor, and the pulley 51. A pulley 52 is fixed at a lower end side of the second hollow turning axis 30. A belt (not shown) bridges between a pulley (not shown), fixed to an output shaft of the third motor, and the pulley 52. As shown in FIG. 5, the pulleys 48, 51, and 52 are so placed in this order from a lower side as to be stacked up in a vertical direction.

As shown in FIG. 7, a recessed part 52a, being recessed upward, is formed at a lower side surface of the pulley 52. As shown in FIG. 8, the recessed part 52a is so shaped as to be almost like an arc having its center at a turning center of the pulley 52, in a view from a vertical direction.

As shown in FIG. 7, a recessed part 51a, being recessed upward, is formed at a lower side surface of the pulley 51. In the same way as the recessed part 52a, the recessed part 51a is so shaped as to be almost like an arc having its center at a turning center of the pulley 51, in a view from a vertical direction. Furthermore, shaped in the pulley 51 is a rounded through-hole 51b that penetrates in a vertical direction, as shown in FIG. 7.

As shown in FIG. 7, shaped in the pulley 48 is a through-hole 48a that penetrates in a vertical direction. The through-hole 48a is so shaped as to be almost like an arc having its center at a turning center of the pulley 48, in a view from a vertical direction. Furthermore, shaped in the pulley 48 is a rounded through-hole 48b that penetrates in a vertical direction.

A bearing 53 and a magnetic shield 54 are placed between an outer circumference surface of the solid turning axis 28 and an inner circumference surface of the first hollow turning axis 29. A bearing 55 and a magnetic shield 56 are placed between an outer circumference surface of the first hollow turning axis 29 and an inner circumference surface of the second hollow turning axis 30. Furthermore, a bearing 58 and a magnetic shield 59 are placed between an inner circumference surface of a support member 57, which is almost cylindrical and fixed to the main body section 7, and an outer circumference surface of the second hollow turning axis 30.

As shown in FIG. 7, the first position detecting mechanism 45 includes an optical sensor 60, having a light emitting element (not shown) and a light receiving element (not shown), both the elements being placed face-to-face each other, as well as a detection plate 61. The sensor 60 is fixed to a sensor mounting portion 62 that is fastened to the main body section 7. The detection plate 61 is made of a light-blocking member, which can interrupt light launched from the light emitting element of the sensor 60 toward the light receiving element; and the detection plate 61 is fixed to an upper side surface of the pulley 51 so as to become enabled to interrupt the light launched from the light emitting element of the sensor 60 toward the light receiving element.

The second position detecting mechanism 46 includes a proximity sensor 63 and a detection plate 64. The proximity sensor 63 is fixed in the through-hole 48b of the pulley 48 by the intermediary of a sensor holding member 65 shaped so as to be almost cylindrical. In other words, the proximity sensor 63 is fixed inside the sensor holding member 65, and the sensor holding member 65 is fixed inside the through-hole 48b. Then, the proximity sensor 63 is fixed to the sensor holding member 65 in such a way that an upper end portion of the proximity sensor 63 protrudes upward somewhat higher than an upper end of the sensor holding member 65. An upper end side of the sensor holding member 65 is located inside the recessed part 51a of the pulley 51. As described above, the recessed part 51a is so shaped as to be almost like an arc having its center at a turning center of the pulley 51, in a view from a vertical direction. Then, the upper end side of the sensor holding member 65 located inside the recessed part 51a serves as a stopper for restricting a turning range of the pulley 48 with respect to the pulley 51.

The detection plate 64 is, for example, made of a magnetic material. The detection plate 64 is fixed to the pulley 51. Specifically to describe, the detection plate 64 is fixed to a part of a bottom surface of the recessed part 51a of the pulley 51. More specifically, the detection plate 64 is fixed to the bottom surface of the recessed part 51a in such a way that a top part of the proximity sensor 63 and the detection plate 64 become face to face each other across a predetermined clearance between them at the time when the solid turning axis 28 is positioned at a predetermined reference position with respect to the first hollow turning axis 29.

The third position detecting mechanism 47 includes a proximity sensor 66 and a detection plate 67. The proximity sensor 66 is fixed in the through-hole 51b of the pulley 51 by the intermediary of a sensor holding member 68 shaped so as to be almost cylindrical. In other words, the proximity sensor 66 is fixed inside the sensor holding member 68, and the sensor holding member 68 is fixed inside the through-hole 51b. Then, the proximity sensor 66 is fixed to the sensor holding member 68 in such a way that an upper end portion of the proximity sensor 66 protrudes upward somewhat higher than an upper end of the sensor holding member 68. An upper end side of the sensor holding member 68 is located inside the recessed part 52a of the pulley 52. As described above, the recessed part 52a is so shaped as to be almost like an arc having its center at a turning center of the pulley 52, in a view from a vertical direction. Then, the upper end side of the sensor holding member 68 located inside the recessed part 52a serves as a stopper for restricting a turning range of the pulley 52 with respect to the pulley 51. In the meantime, a lower end side of the sensor holding member 68 is inserted in the through-hole 48a of the pulley 48. Incidentally, as described above, the through-hole 48a is so shaped as to be almost like an arc having its center at the turning center of the pulley 48, in a view from a vertical direction, and the through-hole 48a is provided in such a way that the sensor holding member 68 fixed to the pulley 51 and the pulley 48 do not contact each other even when the pulley 48 turns relatively with respect to the pulley 51.

The detection plate 67 is, for example, made of a magnetic material. The detection plate 67 is fixed to the pulley 52. Specifically to describe, the detection plate 67 is fixed to a part of a bottom surface of the recessed part 52a of the pulley 52. More specifically, the detection plate 67 is fixed to the bottom surface of the recessed part 52a in such a way that a top part of the proximity sensor 66 and the detection plate 67 become face to face each other across a predetermined clearance between them at the time when the second hollow turning axis 30 is positioned at a predetermined reference position with respect to the first hollow turning axis 29.

As described later, when the solid turning axis 28, the first hollow turning axis 29, and the second hollow turning axis 30 turn together, the first arm 5 and the second arm 6 turn around the turning center "C" as a rotation center without any expansion/retraction. In the present embodiment, the first position detecting mechanism 45 detects that the first arm 5 and the second arm 6 are located at a predetermined home position in a turning direction around the turning center "C" as a rotation center. In other words, at the time when the first arm 5 and the second arm 6 are located at the predetermined home position in the turning direction around the turning center "C" as a rotation center, the detection plate 61 interrupts the light launched from the light emitting element of the sensor 60 toward the light receiving element.

As described later, when the solid turning axis 28 turns, the second arm 6 expands/retracts. Then, as described above, the top part of the proximity sensor 63 and the detection plate 64 become face to face each other across a predetermined clearance between them at the time when the solid turning axis 28 is positioned at a predetermined reference position with respect to the first hollow turning axis 29. In the present embodiment, for example, when the second arm 6 is retracted, the top part of the proximity sensor 63 and the detection plate 64 become face to face each other across a predetermined clearance between them. Namely, the second position detecting mechanism 46 detects that the second arm 6 is under the condition of being retracted.

As described later, when the second hollow turning axis 30 turns, the first arm 5 expands/retracts. Then, as described above, the top part of the proximity sensor 66 and the detection plate 67 become face to face each other across a predetermined clearance between them at the time when the second hollow turning axis 30 is positioned at a predetermined reference position with respect to the first hollow turning axis 29. In the present embodiment, for example, when the first arm 5 is retracted, the top part of the proximity sensor 66 and the detection plate 67 become face to face each other across a predetermined clearance between them. Namely, the third position detecting mechanism 47 detects that the first arm 5 is under the condition of being retracted.

Incidentally, an end of a cable 71 coming from the proximity sensor 63 and an end of a cable 72 coming from the proximity sensor 66 are connected to a rotary joint 73, as shown in FIG. 5. Then, the rotary joint 73 is fixed to a fastening member 74 that is fixed to the main body section 7.

Figure 9A:
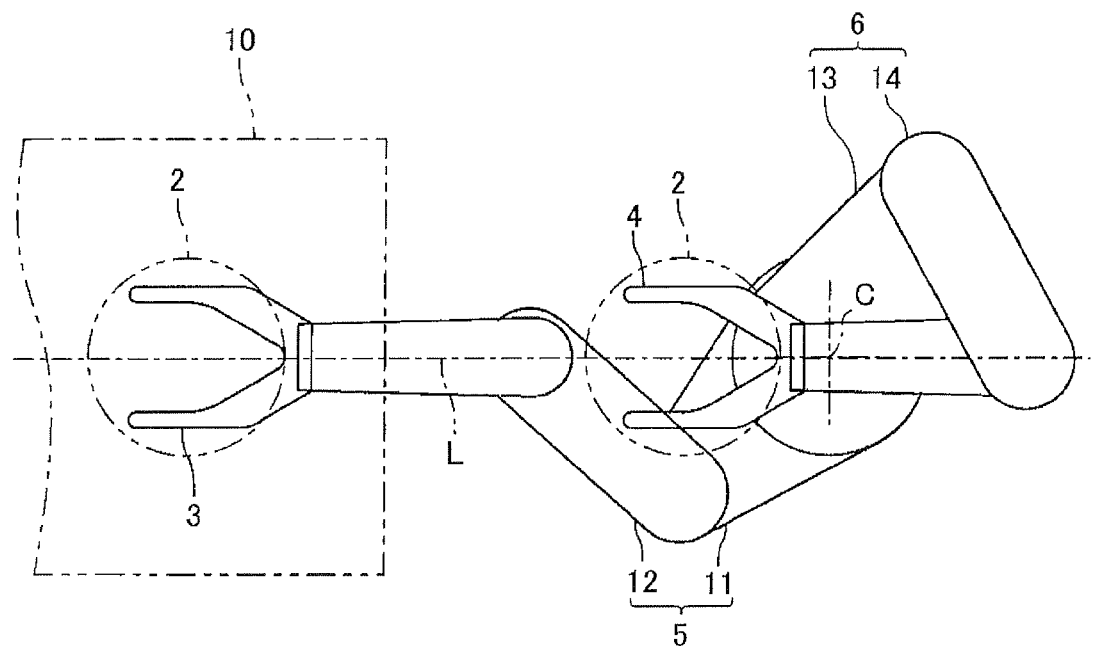
FIG. 9A illustrates the industrial robot under the condition that a first arm is expanded and a second arm is retracted. Meanwhile.
Figure 9B:
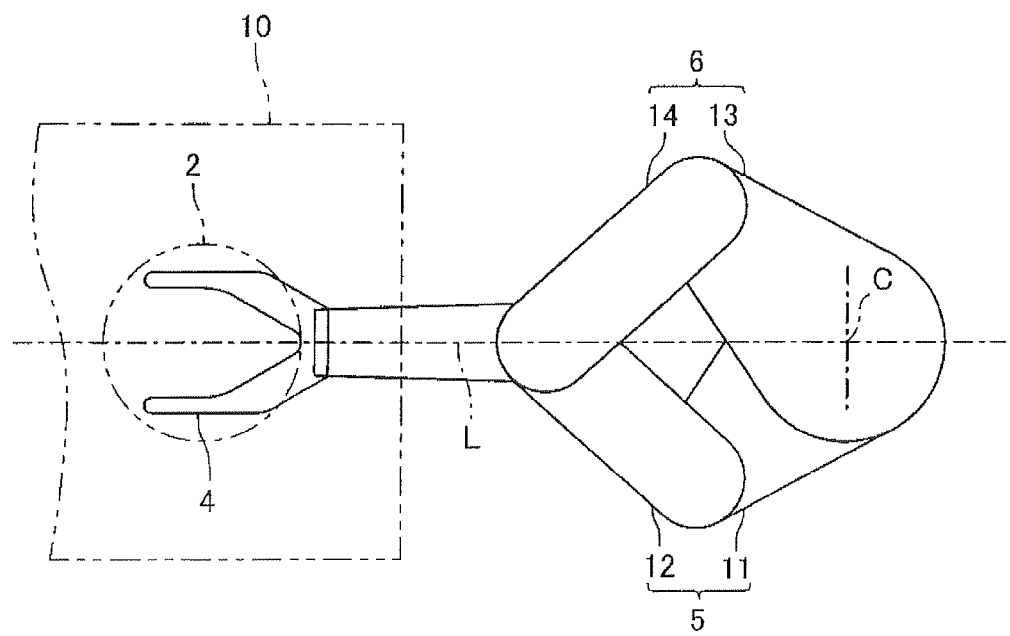
FIG. 9B illustrates the industrial robot under the condition that both the first arm and the second arm are expanded.

General Movement of the Robot:

FIG. 9 includes views for explaining general movement of the robot 1 shown in FIG. 1. FIG. 9A illustrates the robot under the condition that the first arm 5 is expanded and the second arm 6 is retracted. Meanwhile, FIG. 9B illustrates the robot 1 under the condition that both the first arm 5 and the second arm 6 are expanded.

In the present embodiment, as shown in FIG. 1B, if the second hollow turning axis 30 turns under the condition that both the first arm 5 and the second arm 6 are retracted, the first arm 5 expands, as shown in FIG. 9A. Meanwhile, if the solid turning axis 28 turns under the condition that both the first arm 5 and the second arm 6 are retracted, the second arm 6 expands, as shown in FIG. 1A.

If the solid turning axis 28 and the second hollow turning axis 30 turn under the condition that both the first arm 5 and the second arm 6 are retracted, the first arm 5 and the second arm 6 expand as shown in FIG. 9B. Specifically to describe, the first arm 5 and the second arm 6 expand so as to move the first hand 3 and the second hand 4 in the same direction. Meanwhile, if the solid turning axis 28 turns under the condition that the first arm 5 is expanded and the second arm 6 is retracted, the second arm 6 expands and the first arm 5 retracts; and then if the second hollow turning axis 30 turns under the condition that the second arm 6 is expanded, the first arm 5 expands.

In this way, the robot 1 according to the present embodiment can implement expansion/contraction of the first arm 5 and the same of the second arm 6 independently.

If the solid turning axis 28, the first hollow turning axis 29, and the second hollow turning axis 30 turn for the same angle at the same turning speed, the first arm 5 and the second arm 6 turn around the turning center "C" as a rotation center with respect to the main body section 7 under condition that the first arm 5 and the second arm 6 do neither expand nor retract. In other words, the robot 1 carries out turning operation if the solid turning axis 28, the first hollow turning axis 29, and the second hollow turning axis 30 turn for the same angle at the same turning speed. Incidentally, in the present embodiment, the robot 1 carries out turning operation with the first arm 5 and the second arm 6 under the condition of being retracted.

Primary Advantageous Effect of the Present Embodiment:

As explained above, in the present embodiment, the first arm 5 and the second arm 6 can expand/retract independently by means of turning the solid turning axis 28 and/or the second hollow turning axis 30. Therefore, while expanding/retracting independently, the first arm 5 and the second arm 6 can independently take a wafer 2 out of and bring another wafer 2 into the chamber 10. For example, if two vertically-tiered placement tables for wafers 2 are provided inside the chamber 10, it is possible for the first arm 5 and the second arm 6 to simultaneously bring two wafers 2 into the camber 10, and simultaneously take two wafers 2 out of the camber 10. Accordingly, the operation time for transferring the wafers 2 can be reduced.

In the present embodiment, the turning center of the first arm portion 11 and the turning center of the third arm portion 13 are placed coaxially. Furthermore, in the view from the upper elevation over the robot 1 when the first arm 5 and the second arm 6 are retracted, the first arm 5 and the second arm 6 are so constructed as to be almost line-symmetric with respect to an imaginary line "L" in the present embodiment. Moreover, in the present embodiment, the first arm portion 11, the third arm portion 13, the second arm portion 12, and the fourth arm portion 14 are placed in this order from a lower side to a higher side, in a view from a horizontal direction. Still further, in the present embodiment, the first arm 5 and the second arm 6 are shaped in almost the same form. Therefore, in the present embodiment, the first arm 5 and the second arm 6 are well-balanced in terms of their weight. As a result, it becomes possible according to the present embodiment to stabilize expanding/retracting motion of the first arm 5 and the second arm 6 as well as turning motion of the first arm 5 and the second arm 6 with reference to the main body section 7.

Furthermore, in the present embodiment, since the first arm 5 and the second arm 6 are shaped in almost the same form, part of constituent elements of the first arm 5 and part of constituent elements of the second arm 6 can be prepared in accordance with a common design. Therefore, a production cost of the robot 1 can be reduced.

In the present embodiment, the bearing 40 for supporting the third arm portion 13 in such a way to keep it rotatable is fixed to the upper end side of the first hollow turning axis 29 by the intermediary of the bearing retainer 41. Therefore, in comparison to the case where the bearing 40 is mounted in the first arm portion 11, the present embodiment makes it possible to simplify the structure around the bearing 40 so that a section surrounding the bearing 40 can be downsized.

In the present embodiment, placed in the main body section 7 are the first position detecting mechanism 45, the second position detecting mechanism 46, and third position detecting mechanism 47. Therefore, it can be detected in an appropriate manner that; the first arm 5 and the second arm 6 are located at the predetermined home position in the turning direction around the turning center "C" as a rotation center; as well as the first arm 5 and the second arm 6 are under the condition of being retracted.

Other Embodiments

Described above is an example of a preferred embodiment according to the present invention. However, the present invention is not limited to the above embodiment and various variations and modifications may be made without changing the concept of the present invention.

In the embodiment described above, the first arm 5 includes the pulley 15, the pulley 16, the pulley 18, and the pulley 19, these pulleys being as turning members, as well as the belt 17 and the belt 20, these belts being as transmission members. Alternatively, for example, instead of having the pulley 15, the pulley 16, the pulley 18, and the pulley 19, as well as the belt 17 and the belt 20; the first arm 5 may include sprockets as turning members, and chains as transmission members. In such a case, a sprocket placed instead of the pulley 15 is the first turning member placed at the root end side in the first arm portion 11, and a sprocket placed instead of the pulley 16 is the second turning member placed at the top end side in the first arm portion 11. In the meantime, a chain placed instead of the belt 17 is the first transmission member for transmitting drive power from the sprocket as the first turning member to the sprocket as the second turning member.

In the same manner, the second arm 6 includes the pulley 21, the pulley 22, the pulley 24, and the pulley 25, these pulleys being as turning members, as well as the belt 23 and the belt 26, these belts being as transmission members. Alternatively, instead of having the pulley 21, the pulley 22, the pulley 24, and the pulley 25, as well as the belt 23 and the belt 26; the second arm 6 may include sprockets as turning members, and chains as transmission members. In such a case, a sprocket placed instead of the pulley 21 is the third turning member placed at the root end side in the third arm portion 13, and a sprocket placed instead of the pulley 22 is the fourth turning member placed at the top end side in the third arm portion 13. In the meantime, a chain placed instead of the belt 23 is the second transmission member for transmitting drive power from the sprocket as the third turning member to the sprocket as the fourth turning member.

Also, instead of having the pulley 15, the pulley 16, the pulley 18, and the pulley 19, as well as the belt 17 and the belt 20; the first arm 5 may include a series of gears as the turning members and the transmission members. In such a case, a gear placed instead of the pulley 15 is the first turning member placed at the root end side in the first arm portion 11, and a gear placed instead of the pulley 16 is the second turning member placed at the top end side in the first arm portion 11. In the meantime, a gear placed between the gear placed instead of the pulley 15 and the gear placed instead of the pulley 16 is the first transmission member for transmitting drive power from the gear as the first turning member to the gear as the second turning member.

In the same manner, instead of having the pulley 21, the pulley 22, the pulley 24, and the pulley 25, as well as the belt 23 and the belt 26; the second arm 6 may include a series of gears as the turning members and the transmission members. In such a case, a gear placed instead of the pulley 21 is the third turning member placed at the root end side in the third arm portion 13, and a gear placed instead of the pulley 22 is the fourth turning member placed at the top end side in the third arm portion 13. In the meantime, a gear placed between the gear placed instead of the pulley 21 and the gear placed instead of the pulley 22 is the second transmission member for transmitting drive power from the gear as the third turning member to the gear as the fourth turning member.

In the embodiment described above, the first arm 5 and the second arm 6 expand so as to move the first hand 3 and the second hand 4 in the same direction. Alternatively, for example, the first arm 5 and the second arm 6 may expand so as to move the first hand 3 and the second hand 4 in the different directions. According to such a structure, for example, in the case where a plurality of chambers 10 are arranged in a radial manner around the robot 1 as a center, it becomes possible for the first arm 5 and the second arm 6 to simultaneously bring wafers 2 into two chambers 10 and to simultaneously take wafers 2 out of two chambers 10. In this case, it is necessary that a relative angle with respect to the turning center "C" between the two chambers 10, into which the wafers 2 are brought, is the same as a relative angle with respect to the turning center "C" between the two chambers 10, of which the wafers 2 are taken out.

In the embodiment described above, the bearing 40 supporting the third arm portion 13 in such a way to keep it rotatable is fixed to the upper end side of the first hollow turning axis 29 by the intermediary of the bearing retainer 41. Alternatively, for example, the bearing 40 may be fixed directly to the first arm portion 11; and further alternatively, the bearing 40 may be fixed to the first arm portion 11 by the intermediary of a predetermined bearing retainer.

In the embodiment described above, the third arm portion 13 is fixed to the solid turning axis 28, and the first arm portion 11 is fixed to the second hollow turning axis 30. Alternatively, for example, the first arm portion 11 may be fixed to the solid turning axis 28, and the third arm portion 13 may be fixed to the second hollow turning axis 30.

In the embodiment described above, the transfer object to be transferred by the robot 1 is the disc wafer 2. Alternatively, the transfer object to be transferred by the robot 1 may be a substrate shaped to the disc-like, other than the wafer 2; and further alternatively, it may be any substrate and the like, shaped to be polygonal, such as a rectangular substrate and so on.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

REFERENCE NUMERALS

1. Robot (Industrial robot)
2. Wafer (Transfer object)
3. First hand
4. Second hand
5. First arm
6. Second arm
7. Main body section
8. Driving mechanism
10. Chamber (Storing section)
11. First arm portion
12. Second arm portion
13. Third arm portion
14. Fourth arm portion
15. Pulley (First turning member)

16. Pulley (Second turning member)
17. Belt (First transmission member)
21. Pulley (Third turning member)
22. Pulley (Fourth turning member)
23. Belt (Second transmission member)
28. Solid turning axis (First turning axis)
29. First hollow turning axis (Second turning axis)
30. Second hollow turning axis (Third turning axis)
40. Bearing (Third arm portion bearing)
44. First motor (First drive power source)
45. First position detecting mechanism
46. Second position detecting mechanism
47. Third position detecting mechanism
C. Turning center
L. Imaginary line

What is claimed is:
1. An industrial robot for taking a transfer object out of a storing section where the transfer object is stored, and bringing the transfer object into the storing section, the industrial robot comprising:
  a first hand and a second hand, each of which is configured to grasp the transfer object;
  a first arm that supports the first hand so as to keep the first hand rotatable at a top end side of the first arm, the first arm being configured to expand at a time of taking the transfer object out of the storing section, and to retract at a time of bringing the transfer object into the storing section;
  a second arm that supports the second hand so as to keep it rotatable at a top end side of the second arm, the second arm being configured to expand at a time of taking the transfer object out of the storing section, and to retract at a time of bringing the transfer object into the storing section;
  a driving mechanism for expanding and retracting the first arm and the second arm; and
  a main body section that houses a part of the driving mechanism;
  wherein the first arm comprises:
    a first arm portion that is rotatable with respect to the main body section, while using a root end side of the first arm portion as a rotation center; and
    a second arm portion, a root end side of which is so supported as to be rotatable at a top end side of the first arm portion;
  wherein the second arm comprises:
    a third arm portion that is rotatable with respect to the main body section, while using a root end side of the third arm portion as a rotation center; and
    a fourth arm portion, a root end side of which is so supported as to be rotatable at a top end side of the third arm portion;
  wherein a turning center of the first arm portion and a turning center of the third arm portion are placed coaxially;
  wherein, in a view from an upper elevation over the industrial robot when the first arm and the second arm are retracted, the first arm and the second arm are so constructed as to be almost line-symmetric with respect to an imaginary line that passes through the turning center of the first arm portion and the third arm portion;
  wherein the first arm portion, the third arm portion, the second arm portion, and the fourth arm portion are placed in this order from a lower side to a higher side, in a view from a horizontal direction;
  wherein the driving mechanism comprises:
    a first turning axis having its axis center with the turning center of the first arm portion and the third arm portion;
    a second turning axis that is hollow and placed in coaxial with the first turning axis in such a way as to cover an outer circumference of the first turning axis;
    a third turning axis that is hollow and placed in coaxial with the first turning axis in such a way as to cover an outer circumference of the second turning axis;
    a first drive power source for turning the first turning axis;
    a second drive power source for turning the second turning axis; and
    a third drive power source for turning the third turning axis;
    wherein the driving mechanism is configured to expand and retract of the first arm independently from an expansion and retraction of the second arm;
  wherein placed in the main body section are:
    a first position detecting mechanism for detecting a relative turning position of the second turning axis with respect to the main body section;
    a second position detecting mechanism for detecting a relative turning position of the first turning axis with respect to the second turning axis; and
    a third position detecting mechanism for detecting a relative turning position of the third turning axis with respect to the second turning axis;
    a first pulley having a first through-hole that penetrates the first pulley in a vertical direction and wherein the first pulley is fixed at the first turning axis and configured to transmit drive power of the first drive power source to the first turning axis;
    a second pulley having a second through-hole that penetrates the second pulley in a vertical direction and a first recess part that is formed at a lower side of the second pulley and recessed upward and when viewed from a vertical direction, shaped almost like an arc having its center at a turning center of the second pulley, and wherein the second pulley is fixed at the second turning axis and configured to transmit drive power of the second drive power source to the second turning axis;
    a third pulley having a second through-hole that penetrates the third pulley in a vertical direction and a second recess part that is formed at a lower side of the third pulley and recessed upward and when viewed from a vertical direction shaped almost like an arc having its center at a turning center of the third pulley, and wherein the third pulley is fixed at the third turning axis, wherein the third pulley is configured to transmit drive power if the third drive power source to the third turning axis; and
    wherein the first pulley, the second pulley, and the third pulley are so placed in this order form from a lower side auto be stacked up in a vertical direction; and
    wherein the second position detecting mechanism includes:
      a first proximity sensor, wherein the first proximity sensor is fixed in the first through-hole;
      a first detection plate wherein the first detection plate is made of a magnetic material and is fixed to a part of the first recess part; and
      an upper end side of the first sensor holding member, wherein the upper end side of the first sensor holding member is located inside the first recess part and serves as a stopper for restricting a turning range of the first pulley with respect to the second pulley; and wherein the third position detecting mechanism includes:
- a second proximity sensor, wherein the second proximity sensor is fixed in the second through-hole; and
- a second detection plate, wherein the second detection plate is made of a magnetic material and is fixed to a part of the second recess part; and
- an upper end side of the second sensor holding member, wherein the upper end side of the second sensor holding member is located inside the second recess part and serves as a stopper for restricting a turning range of the third pulley with respect to the second pulley.

2. The industrial robot according to claim 1,
wherein the first hand is supported so as to be rotatable at atop end side of the second arm portion; and
wherein the second hand is supported so as to be rotatable at a top end side of the fourth arm portion.

3. The industrial robot according to claim 1,
wherein the first arm comprises:
- a first turning member placed at the root end side in the first arm portion shaped so as to be hollow;
- a second turning member placed at the top end side in the first arm portion; and
- a first transmission member for transmitting drive power from the first turning member to the second turning member;

wherein the second arm comprises:
- a third turning member placed at the root end side in the third arm portion shaped so as to be hollow;
- a fourth turning member placed at the top end side in the third arm portion; and
- a second transmission member for transmitting drive power from the third turning member to the fourth turning member;

wherein the root end side of the third arm portion is fixed to the first turning axis;
wherein the first turning member and the third turning member are fixed to the second turning axis;
wherein the root end side of the first arm portion is fixed to the third turning axis;
wherein the second turning member is supported in the first arm portion so as to be rotatable, and the second arm portion is fixed to the second turning member; and
wherein the fourth turning member is supported in the third arm portion so as to be rotatable, and the fourth arm portion is fixed to the fourth turning member.

4. The industrial robot according to claim 3, wherein each of the first turning member, the second turning member, the third turning member, and the fourth turning member is a pulley, and each of the first transmission member and the second transmission member is a belt.

5. The industrial robot according to claim 4, wherein at least one of the belts is a flat belt made of metal.

6. The industrial robot according to claim 4, wherein at least one of the pulleys is a pulley with gears, and at least one of the belts is a belt with gears.

7. The industrial robot according to claim 3, further comprising:
a third arm portion bearing that supports the third arm portion so as to keep it rotatable, the third arm portion bearing being mounted onto the second turning axis.

\* \* \* \* \*